(12) United States Patent
Park et al.

(10) Patent No.: US 9,368,522 B2
(45) Date of Patent: Jun. 14, 2016

(54) DISPLAY DEVICE AND MANUFACTURING AND TESTING METHODS THEREOF

(71) Applicant: LG Display Co., Ltd., Seoul (KR)

(72) Inventors: Jin Seob Park, Chilgok-gun (KR); Jun Su Kim, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/887,958

(22) Filed: Oct. 20, 2015

(65) Prior Publication Data

US 2016/0043107 A1 Feb. 11, 2016

Related U.S. Application Data

(63) Continuation of application No. 14/539,165, filed on Nov. 12, 2014, now Pat. No. 9,196,552.

(30) Foreign Application Priority Data

Dec. 2, 2013 (KR) .................... 10-2013-0148378
May 26, 2014 (KR) .................... 10-2014-0062855

(51) Int. Cl.
*H01L 27/12* (2006.01)
*G02F 1/1362* (2006.01)
*H01L 21/66* (2006.01)

(52) U.S. Cl.
CPC ........ *H01L 27/124* (2013.01); *G02F 1/136259* (2013.01); *H01L 22/30* (2013.01); *G02F 2203/69* (2013.01); *H01L 22/32* (2013.01); *H01L 22/34* (2013.01); *H01L 27/12* (2013.01); *H01L 2924/01013* (2013.01); *H01L 2924/01079* (2013.01)

(58) Field of Classification Search
CPC .......... G02F 1/136529; G02F 2203/69; G02F 1/1309; H01L 27/124; H01L 22/30; H01L 22/34; H01L 22/32; H01L 2924/01079; H01L 2924/01013; H01L 27/248; H01L 2924/0002; H01L 27/12; H01L 21/775
USPC .................... 257/48, 59, 72, E33/02, E23.01, 257/E27.11; 438/11.15, 22; 349/42, 43, 54, 349/129
See application file for complete search history.

(56) References Cited

U.S. PATENT DOCUMENTS 7,649,586 B2 * 1/2010 Kim .................. G02F 1/136204
324/760.01
2003/0117165 A1 6/2003 Kim
(Continued)

FOREIGN PATENT DOCUMENTS

KR 100679518 B1 2/2007
KR 1020090126052 A 12/2009
(Continued)

*Primary Examiner* — Thinh T Nguyen
(74) *Attorney, Agent, or Firm* — Dentons US LLP

(57) ABSTRACT

A display device is disclosed which includes: gate lines and data lines crossing each other to define unit pixel regions in a display area; a pixel electrode in each unit pixel region; a data shorting bar in a non-display area in substantially parallel with the gate lines; a gate shorting bar in the non-display area in substantially parallel with the data lines; gate link lines electrically connecting the gate lines to the gate shorting bar; data link lines electrically connecting the data lines to the data shorting bar; and shield electrodes on at least one of the gate link lines and the data link lines, the shield electrodes including a conductive material that has a higher melting temperature than that of the at least one of the gate link lines and the data link lines.

20 Claims, 12 Drawing Sheets

(56) References Cited

U.S. PATENT DOCUMENTS

2009/0294771 A1  12/2009  Kim et al.
2011/0095290 A1  4/2011  Koo et al.

FOREIGN PATENT DOCUMENTS

KR  10-1107708 B1  1/2012
KR  10-1157973 B1  6/2012

* cited by examiner

DISPLAY DEVICE AND MANUFACTURING AND TESTING METHODS THEREOF

This application is a Continuation Application of U.S. application Ser. No. 14/539,165 filed Nov. 12, 2014, which claims the benefit of priority of Korean Application Nos. 10-2013-0148378 filed Dec. 2, 2013 and 10-2014-0062855 filed May 26, 2014, all of which are incorporated by reference in their entirety herein.

BACKGROUND OF THE INVENTION

1. Field of the Invention

The present application relates to a display device, a manufacturing method thereof, and a testing method thereof.

2. Discussion of the Related Art

A manufacture procedure of a display device includes a process of manufacturing a substrate provided with thin film transistors, a process of combining PCBs (Printed circuit boards) and so on, which are used to drive the substrate, with the substrate. Also, a testing process is performed in each of the above-mentioned processes.

First, an array testing process is performed when the substrate provided with the thin film transistors is completed, in order to test whether or not any failure is generated in the thin film transistors and pixel patterns and any one of the signal lines is disconnected. Also, a panel testing process is performed before the PCBs are combined with the panel. The panel testing process is used to detect whether or not the panel is normally manufactured.

In the panel test process, it is generally tested whether or not any one of a fault due to a different substance on an active area of the panel, a poor optical property due to a regional thickness deviation in the active area, a point defect due to a poor thin film transistor and a line defect due to the disconnection of a gate or data line is generated. The general test result determines whether the panel is poor, acceptable or good.

The panel test process can be performed in one of an A/P test mode, a vision test mode and a shorting bar test mode.

The shorting bar test mode applies test signals to shorting bars which are connected to gate pads and data pads on the panel, in order to test the panel.

Such a shorting bar test mode can solve disadvantages of the A/P test mode and the vision test mode. However, the shorting bar test mode must electrically disconnect the shorting bars from the pads after the panel is tested. To this end, the panel is cut along a trimming line or a cutting line. In this time, odd and even electrodes may be melted. Due to this, a short circuit can be generated between the melted odd and even electrodes. Moreover, a small-sized panel forces the distance between the pads to become smaller. As such, the short circuit can be more easily generated between the electrodes when the panel is cut along the trimming line or the cutting line.

SUMMARY OF THE INVENTION

Accordingly, the present invention is directed to a display device and manufacturing and testing methods thereof that substantially obviates one or more of the problems due to limitations and disadvantages of the related art.

An advantage of the present invention is to provide a display device and manufacturing and testing methods thereof that are adapted to reduce or prevent a short circuit between pads in a process of cutting a pad portion.

Another advantage of the present invention is to provide a display device and manufacturing and testing methods thereof that are adapted to protect electrodes in a pad portion in a process of cutting the pad portion.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a display device may, for example, include gate lines and data lines crossing each other to define unit pixel regions in a display area; a pixel electrode in each unit pixel region; a data shorting bar in a non-display area in substantially parallel with the gate lines; a gate shorting bar in the non-display area in substantially parallel with the data lines; gate link lines electrically connecting the gate lines to the gate shorting bar; data link lines electrically connecting the data lines to the data shorting bar; and shield electrodes on at least one of the gate link lines and the data link lines, the shield electrodes including a conductive material that has a higher melting temperature than that of the at least one of the gate link lines and the data link lines.

The display device according to one general aspect of the present embodiments allows the shield electrodes to overlap with a trimming line which is used for cutting away the shorting bars from the display area.

The display device according to one general aspect of the present embodiments further includes gate pads connected to the respective gate link lines, and data pads connected to the respective data link lines.

The display device according to one general aspect of the present embodiments allows the shield electrodes to be formed between the gate shorting bar and the gate pad and between the data shorting bar and the data pad.

The display device according to one general aspect of the present embodiments allows the shield electrode to be formed from a transparent electrode material which is used to form the pixel electrode and the common electrode.

The display device according to one general aspect of the present embodiments allows the shield electrodes to be formed on all of the gate link lines and the data link lines.

The display device according to one general aspect of the present embodiments allows not only the gate link lines to include odd gate link lines and even gate link lines but also the data link lines to include odd data link lines and even data link lines. The even gate link lines and the even data link lines are the shield electrodes.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
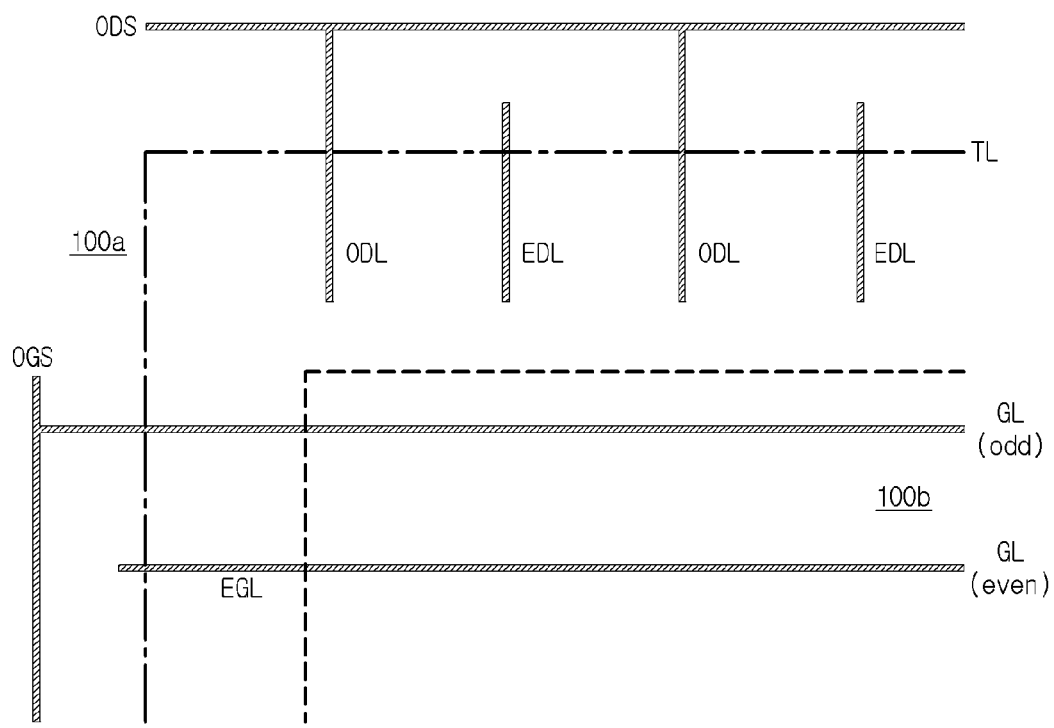
FIGS. 1 through 3 are layout views illustrating arrangement of electrodes on a display panel according to the first embodiment of the present invention.

Reference will now be made in detail to embodiments of the present invention, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

Method for Forming Electrodes of a Display Panel According to the First Embodiment An arrangement of electrodes of a display device according to the first embodiment of the present invention will now be explained with reference to FIGS. 1 through 3.

A display panel 100 can include a transparent substrate. The display panel 100 can be defined into a non-display area 100a and a display area 100b.

Referring to FIG. 1, an odd data shorting bar ODS, an odd gate shorting bar OGS, odd and even data link lines ODL and EDL, and odd and even gate link lines OGL and EGL can be arranged in the non-display area 100a.

The odd and even data link lines ODL and EDL each include a plurality of link lines. The odd and even data link lines ODL and EDL are arranged alternately with each other. The odd and even gate link lines OGL and EGL each include a plurality of link lines. The odd and even gate link lines OGL and EGL are arranged alternately with each other.

The gate link lines OGL and EGL are used to connect gate lines GL and the gate shorting bars OGS and EGS. The data link lines ODL and EDL are used to connect the data lines DL and the data shorting bar ODS and EDS.

In detail, the odd data link lines ODL are formed in such a manner as to be directly connected to the odd data shorting bar ODS and extend from the odd data shorting bar ODS in perpendicular directions. The odd gate link lines OGL are formed in such a manner as to be directly connected to the odd gate shorting bar OGS and extend from the odd gate shorting bar OGS in perpendicular directions.

The odd and even gate link lines OGL and EGL can be connected to the gate lines GL in a one-to-one relationship.

The even data link lines EDL and the even gate link lines EGL can be formed on the non-display area 100a opposite to a cutting line which is called as a trimming line TL.

The gate lines GL can be formed in such a manner as to be arranged in the display area 100b and directly connected to the odd and even gate link lines OGL and EGL, wherein each odd gate line is connected to an associated odd gate link line OGL and each even gate line is connected to an associated even gate link line EGL. Also, the gate lines GL can be arranged perpendicularly to the odd gate shorting bar OGS. Moreover, the gate lines GL can extend from the respective gate link lines OGL and EGL.

The odd data shorting bar ODS, the odd gate shorting bar OGS, the odd and even data link lines ODL and EDL and the odd and even gate link lines OGL and EGL on the non-display area 100a and the gate lines GL on the display area 100b can be formed from the same material as a gate electrode through a common process (e.g., one or more simultaneously carried out processes). In detail, the odd data shorting bar ODS, the odd gate shorting bar OGS, the odd and even data link lines ODL and EDL, the odd and even gate link lines OGL and EGL and the gate lines GL can be simultaneously formed by depositing a metal such as chromium Cr, molybdenum Mo, tantalum Ta, antimony Sb and so on, on an entire surface of a substrate and patterning the deposited metal using a mask procedure.

Figure 2:
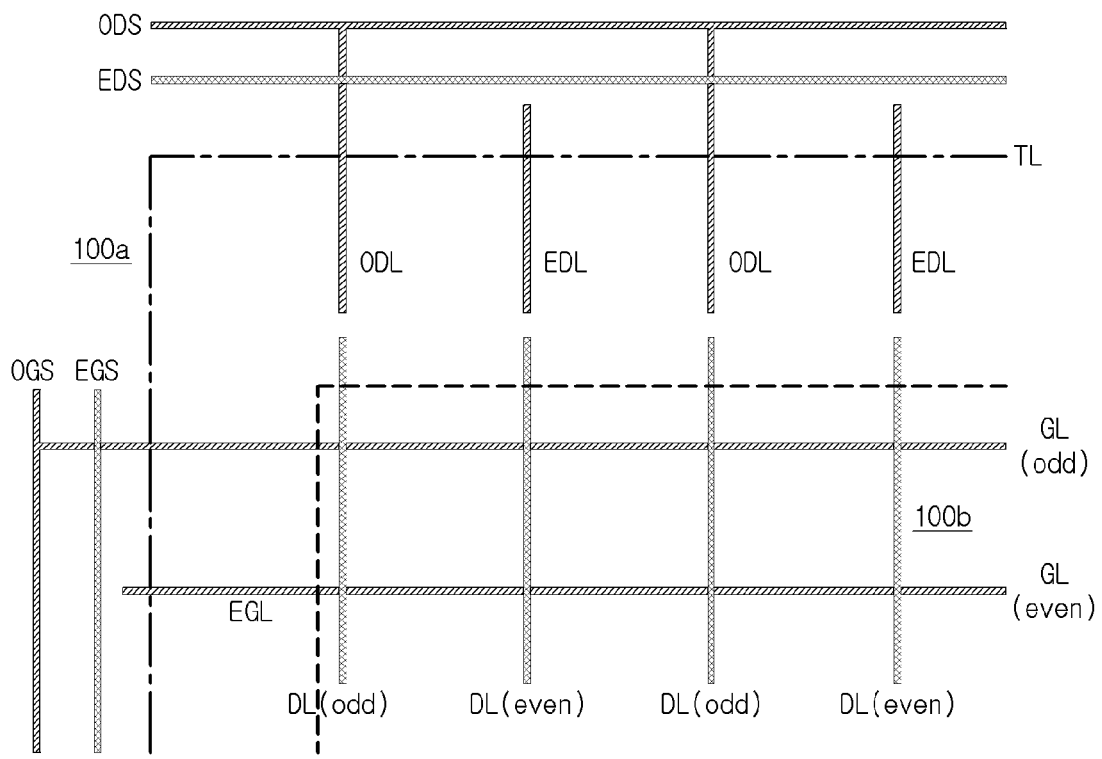

As illustrated in FIG. 2, the even data shorting bar EDS and the even gate shorting bar EGS can be formed in the non-display area 100a.

The even data shorting bar EDS can be formed in such a manner as to be separate from and parallel to the odd data shorting bar ODS. The even gate shorting bar EGS can be formed in such a manner as to be separate from and parallel to the odd gate shorting bar OGS.

A plurality of data lines DL can be formed in the display area 100b. The plurality of data lines DL are arranged in such a manner as to cross the gate lines GL. Also, each of the data lines DL can be formed in the same line as the odd and even data link lines ODL and EDL. Moreover, the data lines DL can be formed in such a manner as to be separated from the odd and even data link lines ODL and EDL.

The even data shorting bar EDS, the even gate shorting bar EGS and the data lines DL can be formed from the same material as source and drain electrodes. Also, the even data shorting bar EDS, the even gate shorting bar EGS, the data lines DL and the source and drain electrodes can be simultaneously formed through a common process (or the same process).

Meanwhile, an insulation material is first deposited on an entire surface of the substrate before the even data shorting bar EDS, the even gate shorting bar EGS and the data lines DL are formed. In detail, after a gate insulation film including an inorganic insulation material such as silicon nitride or silicon oxide is formed, the even data shorting bar EDS, the even gate shorting bar EGS and the data lines DL can be formed by depositing a metal such as chromium Cr or the like on the gate insulation film and patterning the deposited metal using a mask procedure.

In other words, the above-mentioned electrodes can be formed on the substrate 100 by sequentially performing the first through third processes. The first process forms the odd data shorting bar ODS, the odd and even data link lines ODL and EDL, the odd gate shorting bar OGS, the odd and even gate link lines OGL and EGL and the odd and even gate lines GL, which each include the same material as the gate electrode on the substrate 100, as illustrated in FIG. 1. The second process forms the gate insulation film on an entire surface of the substrate 100, which is provided with the odd data shorting bar ODS, the odd and even data link lines ODL and EDL, the odd gate shorting bar OGS, the odd and even gate link lines OGL and EGL and the odd and even gate lines GL. The third process forms the even data shorting bar EDS, the odd and even data lines DL and the even gate shorting bar EGS on the gate insulation film, as illustrated in FIG. 2. As a result, the electrodes formed through the first process and the electrodes formed through the third process can be provided in different layers from each other.

Figure 3:
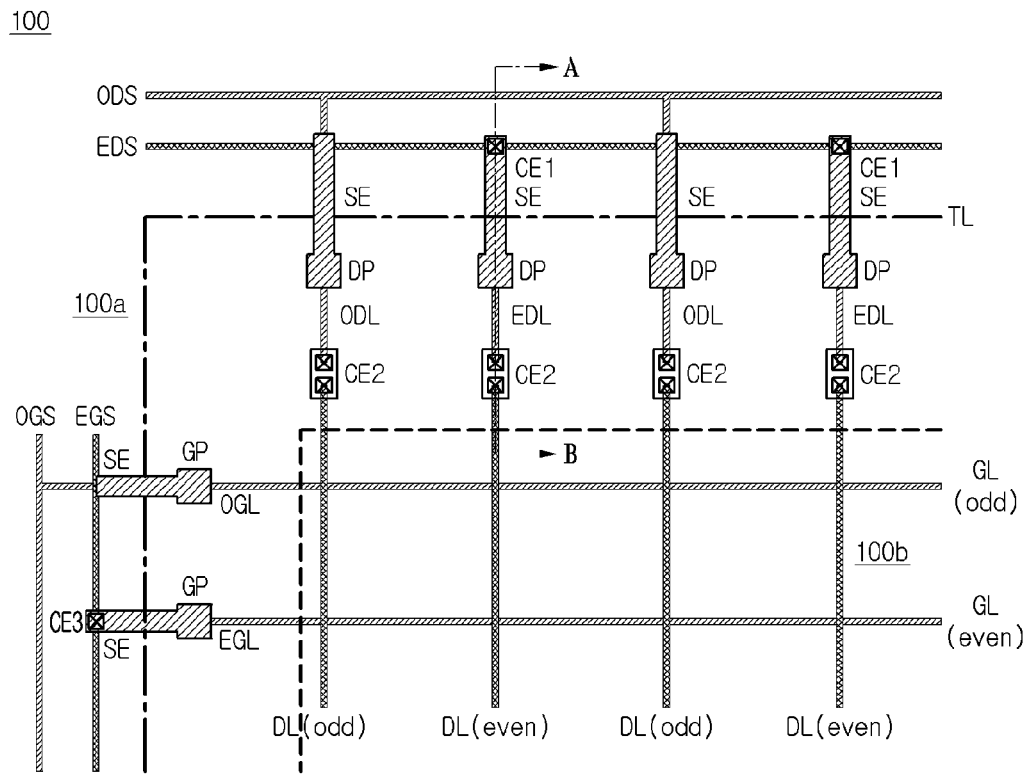

Referring to FIG. 3, data pads DP, gate pads GP and contact electrodes CE can be formed in the non-display area 100a.

The gate pads GP can be formed on the gate link lines OGL and EGL. The data pads DP can be formed on the data link lines ODL and EDL.

The gate pads GP can be connected to the respective gate link lines OGL and EGL. The data pads DP can be connected to the respective data link lines ODL and EDL.

After the display panel 100 is tested, data and gate signals are applied to the data pads DP and one of the gate pads GP in order to drive pixels opposite to the data pads DP and the gate pad GP. The contact electrodes CE can include first through third contact electrodes CE1, CE2 and CE3. The first contact electrodes CE1 are used to electrically connect the even data link lines EDL to the even data shorting bar EDS. The second contact electrodes CE2 are used to electrically connect the odd and even data link lines ODL and EDL to the data lines DL. The third contact electrodes CE3 are used to electrically connect the even gate link lines EGL to the even gate shorting bar EGS.

After the even data shorting bar EDS, the even gate shorting bar EGS and the data lines DL are formed, a passivation layer PA is formed by coating or depositing an insulation material on an entire surface of the substrate provided with the even data shorting bar EDS, the even gate shorting bar EGS and the data lines DL, and the contact electrodes CE of a conductive material such as ITO (indium-tin-oxide) can be formed as illustrated in FIG. 3.

Each of the contact electrodes CE electrically connects electrodes, which are formed in different layers, to each other through a contact hole. Some of the contact electrodes CE can electrically connect the odd and even data link lines ODL and EDL and the data lines DL externally exposed through the contact holes which are formed by partially etching the passivation layer PA and the gate insulation film. The other contact electrodes can electrically connect the even gate link lines EGL and the gate shorting bar EDS externally exposed through the contact holes which are formed by partially etching the passivation layer PA and the gate insulation film.

The shield electrodes SE covering the gate link lines OGL and EGL and the data link lines ODL and EDL can be formed in the non-display area 100a. The shield electrodes SE can be formed in the non-display area overlapping with the trimming line TL which is used for cutting away the gate and data shorting bars OGS, EGS, ODS and EDS from the display area 100b. Also, the shield electrodes SE can be formed on the gate link lines OGL and EGL and the data link lines ODL and EDL. In detail, the shield electrodes SE can be formed on outer half regions of the odd and even data link lines ODL and EDL and outer half regions of the odd and even gate link lines OGL and EGL. In other words, the shield electrodes SE can be formed between the gate shorting bar OGS and EGS and the gate pads GP and between the data shorting bar ODS and EDS and the data pad DP.

The shield electrodes SE can be formed from a transparent conductive material which forms a pixel electrode Pix and a common electrode Com. In other words, the shield electrode SE can be formed from an electrode material such as ITO (indium-tin-oxide).

Also, the contact electrodes CE, the shield electrode SE and the data pad DP can be simultaneously formed through the same formation process. And the shield electrode SE and the gate pad GP can be simultaneously formed through the same formation process.

Figure 4:
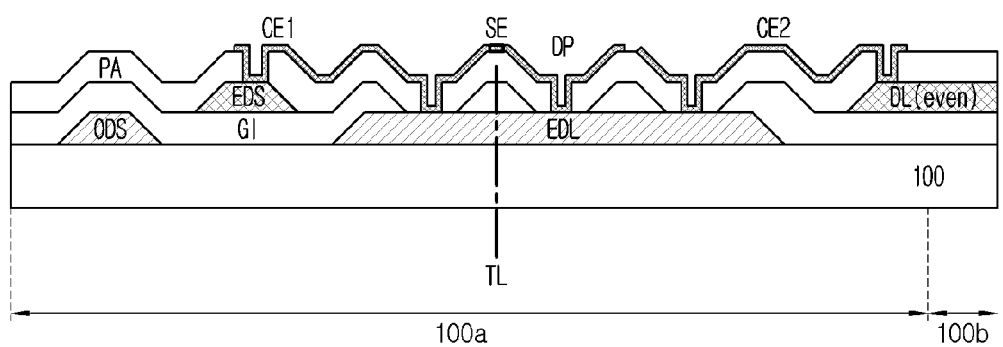
FIG. 4 is a cross-sectional view taken along dotted line A-B in FIG. 3.

FIG. 4 is a cross-sectional view taken along dotted line A-B in FIG. 3.

A procedure of forming an electrode structure according to the first embodiment of the disclosure will now be explained with reference to FIG. 5.

The substrate 100 is defined into the non-display area 100a and the display area 100b. A region of the trimming line TL represented by an alternate long and short dash line is defined within the non-display area 100b.

An odd data short bar ODS, an even data link line EDL, and a gate electrode G, which each include a gate electrode material, can be formed on the substrate 100 through a first process.

Subsequently, a gate insulation film GI of an inorganic insulation material such as silicon nitride or silicon oxide can be formed on an entire surface of the substrate provided with the odd data shorting bar ODS, the even data link line EDL and the gate electrode G through a second process.

The even data shorting bar EDS and the even data lines DL, which are formed of a source or drain electrode material, can be formed through a third process. In detail, the even data shorting bar EDS and the even data line DL can be formed by depositing a metal such as chromium Cr on the gate insulation film GI and patterning the deposited metal using a mask procedure.

In a fourth process, the passivation layer PA used as a protective film can be formed by coating or depositing an insulation material on an entire surface of the substrate 100 provided with the even data shorting bar EDS and the even data line DL.

Thereafter, a fifth process forming contact electrodes CE and data pads DP, which are formed from a transparent conductive material such as ITO (indium-tin-oxide), is performed. In the fifth process, the contact holes are formed in the gate insulation film GI and the passivation layer PA, and the contact electrodes CE and the data pad DP are formed on the passivation layer PA. The contact electrodes CE can be used for electrically connecting the even data shorting bar EDS, the even data link line EDL and the even data line DL(even) to one another. The data pad DP can be connected to the even data link lines EDL.

A procedure of forming a shield electrode according to the first embodiment of the present invention will now be explained.

The shield electrode SE of a transparent conductive material such as ITO can further be formed on the passivation layer PA above and corresponding the trimming line TL. The shield electrode SE can be simultaneously formed with the contact electrodes CE and the data pad DP through the fifth process, because it is also formed from ITO.

Figure 5:
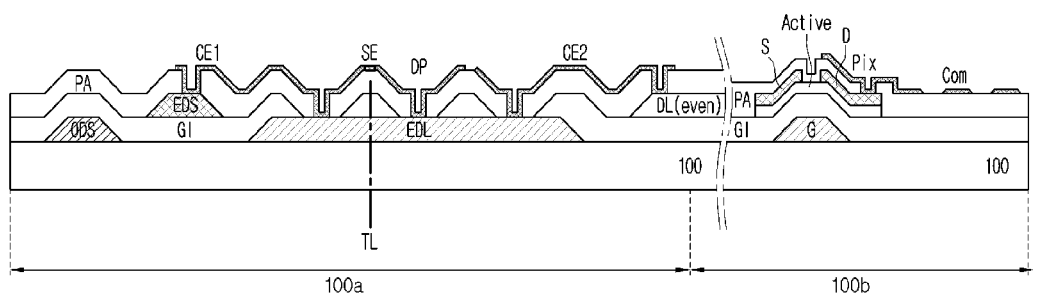
FIG. 5 is a cross-sectional view illustrating a non-display area and a pixel region of a display area.

FIG. 5 is a cross-sectional view illustrating an electrode structure of a non-display area and an electrode structure of a pixel region of a display area according to the first embodiment of the present invention.

A gate line GL and a data line DL crossing each other and defining a unit pixel region can be formed in the display area 100b of the substrate 100. A pixel electrode Pix and a common electrode Com, which are used to form a horizontal (or an in-plane) electric field, can be formed in the unit pixel region.

Odd and even gate shorting bars OGS and EGS parallel to the data line DL can be formed in the non-display area 100a of the substrate 100. Also, odd and even data shorting bars ODS and EDS parallel to the gate line GL can be formed in the non-display area 100a of the substrate 100.

Referring to FIG. 5, a thin film transistor, a passivation layer PA covering the thin film transistor, and a pixel electrode Pix and a common electrode Com formed on the passivation layer PA can be included in the unit pixel region of the display area 100b. The thin film transistor includes a gate electrode G formed on the substrate 100, a gate insulation film GI covering the gate electrode G, an active layer formed on the gate insulation film GI, and source and drain electrodes S and D formed on the active layer. The pixel electrode Pix comes in contact with the drain electrode D of the thin film transistor through a contact hole formed in the passivation layer PA.

In the pixel region with a top common electrode structure, the gate electrode G can be simultaneously formed with the odd data shorting bar ODS and the even data link line EDL through the first process illustrated in FIG. 4.

Also, the source and drain electrode S and D can be simultaneously formed with the even data shorting bar EDS and the even data line DL through the third process illustrated in FIG. 4.

Moreover, the pixel electrode Pix and the common electrode Com can be simultaneously formed when one of the contact electrode CE, the data pad DP and the shield electrode SE is formed.

Also, in the IPS (In-plane switching) mode, the pixel electrode Pix and the common electrode Com can be simultaneously formed on the same layer. And the pixel electrode Pix and the common electrode Com can be simultaneously formed with the data pad DP, the gate pad GP, the contact electrodes CE and the shield electrode SE through the same formation process as the data pad DP, the gate pad GP, the contact electrodes CE and the shield electrode SE.

When the substrate 100 is cut along the trimming line TL, the shield electrodes SE according to the first embodiment of the present invention can reduce or prevent a short circuit between the odd and even data link lines ODL and EDL and between the odd and even gate link lines OGL and EGL, which may occur due to a spread of the melted odd and even data link lines ODL and EDL and the odd and even gate link lines OGL and EGL during the cutting process.

ITO has a higher hardness and thus melts less compared to the gate electrode material when the substrate 100 is cut along the trimming line TL. As such, the shield electrodes SE, which are formed from the ITO electrode material and above the odd and even data link lines ODL and EDL and the odd and even gate link lines OGL and EGL, can reduce melt and spread of the odd and even data link lines ODL and EDL and the odd and even gate link lines OGL and EGL during the cutting process.

In general, signals are transferred from the non-display area 100a to the display area 100b. The lines on the non-display area 100a are formed denser than these of the display area 100b. As a result, a short circuit may be easily generated between the lines (or electrodes) on the non-display area 100a. However, the electrode arrangement according to the first embodiment of the present invention may reduce or prevent generation of such a short circuit during the cutting process.

Method for Forming Electrodes of a Display Panel According to the Second Embodiment An electrode arrangement of a display panel according to the second embodiment of the present invention will now be explained with reference to FIGS. 6 through 9.

In the second embodiment, odd data lines are lines connected to respective odd data link lines, even data lines are lines connected to respective even data link lines, odd gate lines are lines connected to respective odd gate link lines, and even gate lines are lines connected to respective even gate link lines.

Components of the second embodiment having the same or similar functions and shapes as those of the first embodiment may be referred to by the same reference numbers and names. Also, the description of the second embodiment overlapping with the first embodiment may be omitted.

Also, the even data link lines EDL and the even gate link lines EGL of the second embodiment can be replaced with the shield electrode SE.

The display panel 100 is defined into a non-display area 100a and a display area 100b.

Figure 6:
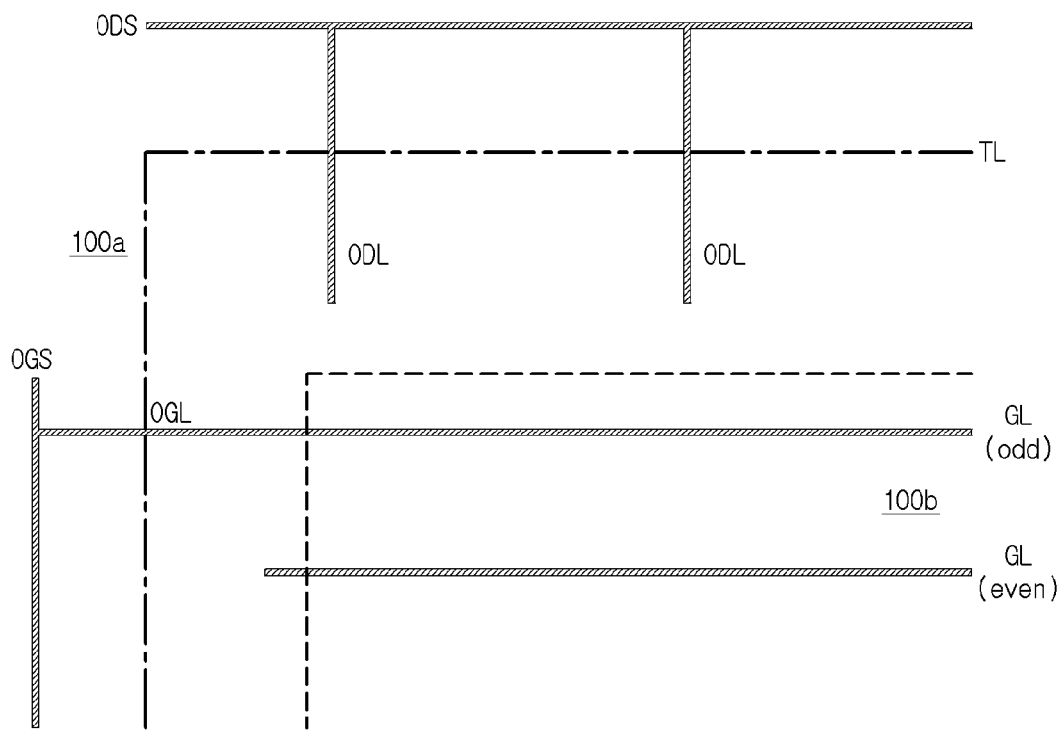
FIGS. 6 through 8 are layout views illustrating arrangement of electrodes on a display panel according to the second embodiment of the present invention.
Figure 7:
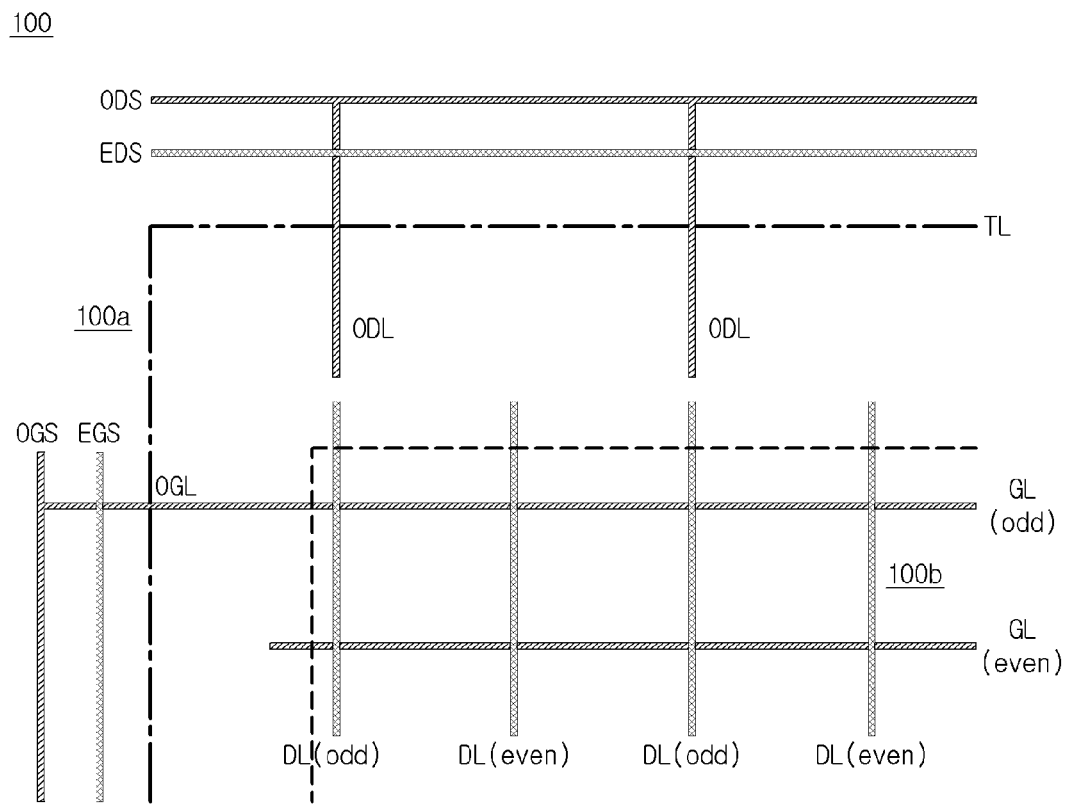

Referring to FIG. 6, an odd data shorting bar ODS, a plurality of odd gate shorting bar OGS, odd data link lines ODL and a plurality of odd gate link line OGL are arranged in the non-display area 100a.

The plurality of odd data link lines ODL can be separated from one another in a suitable distance to arrange even data link lines (not shown). Similarly, the odd gate link lines OGL can be separated from one another in a suitable distance to arrange even gate link lines (not shown).

The odd data link lines ODL can be formed in such a manner as to be directly connected to the odd data shorting bar ODS. The odd data link lines ODL and the odd data shorting bar ODS can be arranged perpendicularly to each other. Similarly, the odd gate link lines OGL can be formed in such a manner as to be directly connected to the odd gate shorting bar OGS. The odd gate link lines OGL and the odd gate shorting bar OGS can be arranged perpendicularly to each other.

The odd gate link lines OGL can be connected to respective gate lines GL.

In the display area 100b, odd gate lines GL(odd) directly connected to the respective odd gate link lines OGL can be arranged. The odd gate lines GL(odd) can extend from the respective odd gate link lines OGL in directions perpendicular to the odd gate shorting bar OGS.

Among the gate lines GL, even gate lines GL(even), which will be connected to respective even gate link lines (not shown) and formed later, can be formed throughout the display area 100b and a part of the non-display area 100a. In other words, the even gate lines GL(even) can be formed in such a manner as to extend to a region of the non-display area 100a between a trimming line TL and an edge line of the display area 100b. However, the even gate lines GL(even) be beneficially formed without reaching the trimming line TL.

The odd data shorting bar ODS, the odd gate shorting bar OGS, the odd data link lines ODL and the odd gate link lines OGL on the non-display area 100a and the gate lines GL on the display area 100b can be formed from the same material as a gate electrode material and simultaneously through a common process.

Figure 8:
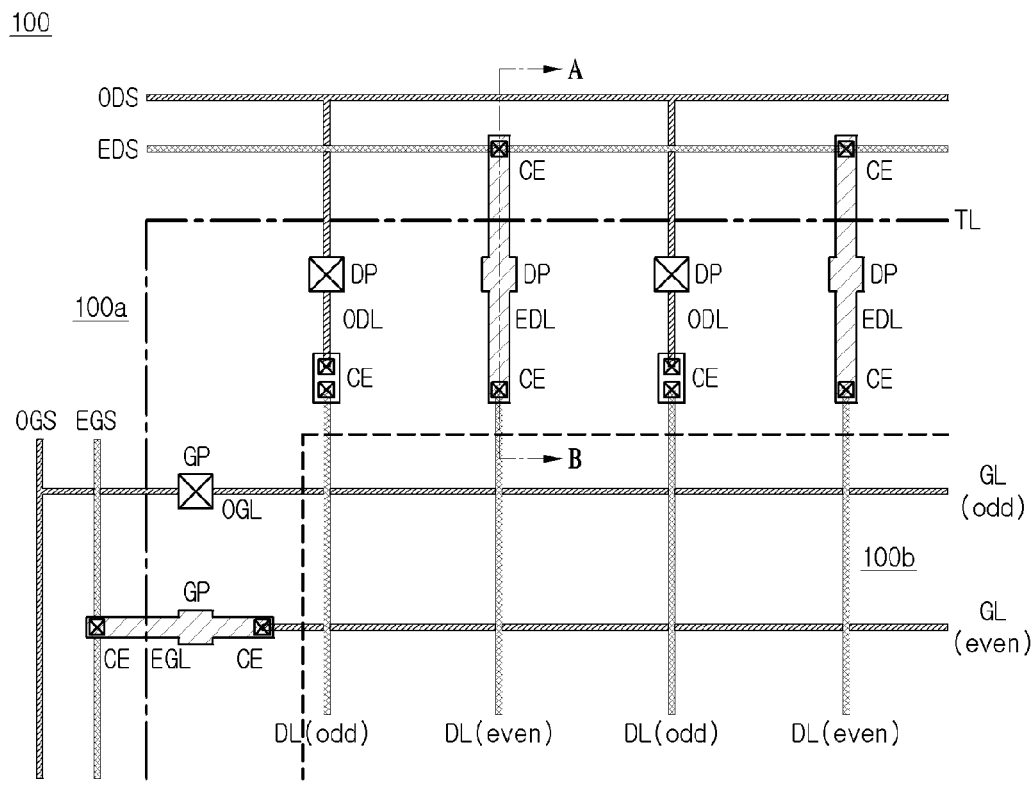

As illustrated in FIG. 8, an even data shorting bar EDS and an even gate shorting bar EGS can be formed in the non-display area 100a. The even data shorting bar EDS can be separated from and formed parallel to the odd data shorting bar ODS. Similarly, the even gate shorting bar EGS can be separated from and formed parallel to the odd gate shorting bar OGS.

Also, a plurality of data lines DL can be formed in the display area 100b. The data lines DL can be formed to cross the gate lines GL. Each of the data lines DL can be formed in such a manner as to extend from the respective odd data link line ODL, but be separated from the respective odd data link line ODL.

The even data shorting bar EDS, the even gate shorting bar EGS and the data lines DL can be formed from the same material as a source or drain electrode material. Also, the even data shorting bar EDS, the even gate shorting bar EGS and the data lines DL can be simultaneously formed through a common process.

Meanwhile, before the formation of the even data shorting bar EDS, the even gate shorting bar EGS and the data lines DL, an insulation material can be deposited on the display panel 100.

Referring to FIG. 8, even data link lines EDL connecting the even data lines DL(even) to the even data shorting bar EDS can be formed on the non-display area 100a. The even data link lines EDL can be formed in regions between the odd data link lines ODL. In other words, the even data link lines EDL can be arranged alternately with the odd data link lines ODL. Also, even gate link lines EGL connecting the even gate lines GL(even) to the even gate shorting bar EGS can be formed in the non-display area 100a. The even gate link lines EGL can be formed in regions between the odd gate link lines OGL. In other words, the even gate link lines EGL can be arranged alternately with the odd gate link lines OGL.

The even data link lines EDL can connect the even data lines DL(even) to the even data shorting bar EDS via link line contact holes. Similarly, the even gate link lines EGL can connect the even gate lines GL(even) to the even gate shorting bar EGS via link line contact holes.

To this end, the even data link lines EDL and the even gate link lines EGL can be connected to electrodes (i.e., the even data shorting bar EDS, the even gate shorting bar EGS, the even data lines DL(even) and the even gate lines GL(even)), which are formed in a lower layer thereof, via respective contact holes.

The even data link lines EDL and the even gate link lines EGL can be formed of an ITO electrode material. Also, the even data link lines EDL and the even gate link lines EGL can be simultaneously formed through a common process.

The contact electrodes CE can be formed on the non-display area 100a. The contact electrodes CE can be used to electrically connect the respective odd data link lines ODL and the respective odd data lines DL(odd).

Each of the contact electrodes CE electrically connects electrodes (i.e., the odd data line DL(odd) and the odd data link line ODL), which are formed in different layers, to each other.

The even data link lines EDL, the data pad DP and the contact electrodes CE, which are illustrated in FIG. 8, can be formed from a transparent conductive material such as ITO (indium-tin-oxide). Also the even data link lines EDL, the data pad DP and the contact electrodes CE can be simultaneously formed through the same process (or a common process).

The even gate link lines EGL, the gate pad GP and the contact electrodes CE, which are illustrated in FIG. 8, can be formed from a transparent conductive material such as ITO (indium-tin-oxide). Also the even gate link lines EGL, the gate pad GP and the contact electrodes CE can be simultaneously formed through the same process (or a common process).

Figure 9:
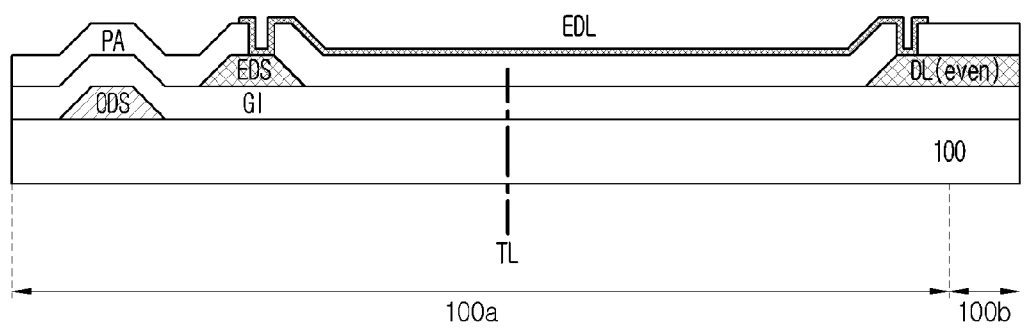
FIG. 9 is a cross-sectional view taken along dotted line A-B in FIG. 8.

FIG. 9 is a cross-sectional view taken along dotted line A-B in FIG. 8.

Referring to FIG. 9, the substrate 100 is defined into the non-display area 100a and the display area 100b. Also, a region of the trimming line TL represented by an alternate long and short dash line is defined within the non-display area 100a.

An odd data short bar ODS, which is formed of a gate electrode material, can be formed on the substrate 100 through a first process.

Subsequently, a gate insulation film GI of an inorganic insulation material such as silicon nitride or silicon oxide can be formed on an entire surface of the substrate provided with the odd data shorting bar ODS through a second process.

An even data shorting bar EDS and an even data line DL, which are formed of a source or drain electrode material, can be formed through a third process. In detail, the even data shorting bar EDS and the even data line DL can be formed by depositing a metal such as chromium Cr on the gate insulation film GI and patterning the deposited metal using a mask procedure.

In a fourth process, a passivation layer PA used as a protective film can be formed by coating or depositing an insulation material on an entire surface of the substrate 100 provided with the even data shorting bar EDS and the even data line DL.

Thereafter, an even data link line EDL of a transparent electrode material such as ITO (indium-tin-oxide) is formed through a fifth process. In the fifth process, contact holes are formed in the passivation layer PA and the even data link line EDL is formed on the passivation layer PA. The even data link line EDL can electrically connect the even data line DL(even) to the even data shorting bar EDS.

The second embodiment of the present invention allows the even data link lines EDL arranged between the odd data link lines ODL to be formed from a transparent conductive material such as ITO, not the gate electrode material, which is different from the first embodiment. In other words, the even data link line EDL and the even gate link line EGL of the second embodiment can become the shield electrode SE of the first embodiment. As such, a distance between the odd data link lines ODL formed of the gate electrode material can be sufficiently secured.

As a result, when the display panel 100 is cut along the trimming line TL, generation of a short circuit between the odd data link lines ODL can be reduced or prevented even when the odd data link lines ODL are melted and peripherally spread. Similarly, the even gate link lines EGL arranged between the odd gate link lines OGL are formed of a transparent conductive material such as ITO, not the gate electrode material, and a distance between the odd gate link lines OGL formed of the gate electrode material can be sufficiently secured. Therefore, when the display panel 100 is cut along the trimming line TL, generation of a short circuit due to melt and peripheral spread of the odd data link lines ODL can be reduced or prevented.

Also, the odd data link lines ODL and the even data link lines EDL are formed in different layers from each other. As such, although the odd and even data link lines ODL and EDL are melted, generation of a short circuit between the data link lines ODL and EDL can be reduced or prevented. As a result, not only can the odd data link lines ODL and the even data link lines EDL be densely formed, but the data lines DL can also be densely formed. Similarly, the odd gate link lines OGL and the even gate link lines EGL are formed in different layers. As such, the odd and even gate link lines OGL and EGL and the gate lines GL can be densely formed.

Method for Forming Electrodes of a Display Panel According to the Third Embodiment An electrode arrangement of a display panel 100 according to the third embodiment of the present invention will now be explained with reference to FIG. 13.

Components of the third embodiment having the same or similar functions and shapes as those of the first and second embodiments may be referred to by the same reference numbers and names. Also, the description of the third embodiment overlapping with the first and second embodiments may be omitted.

Figure 10:
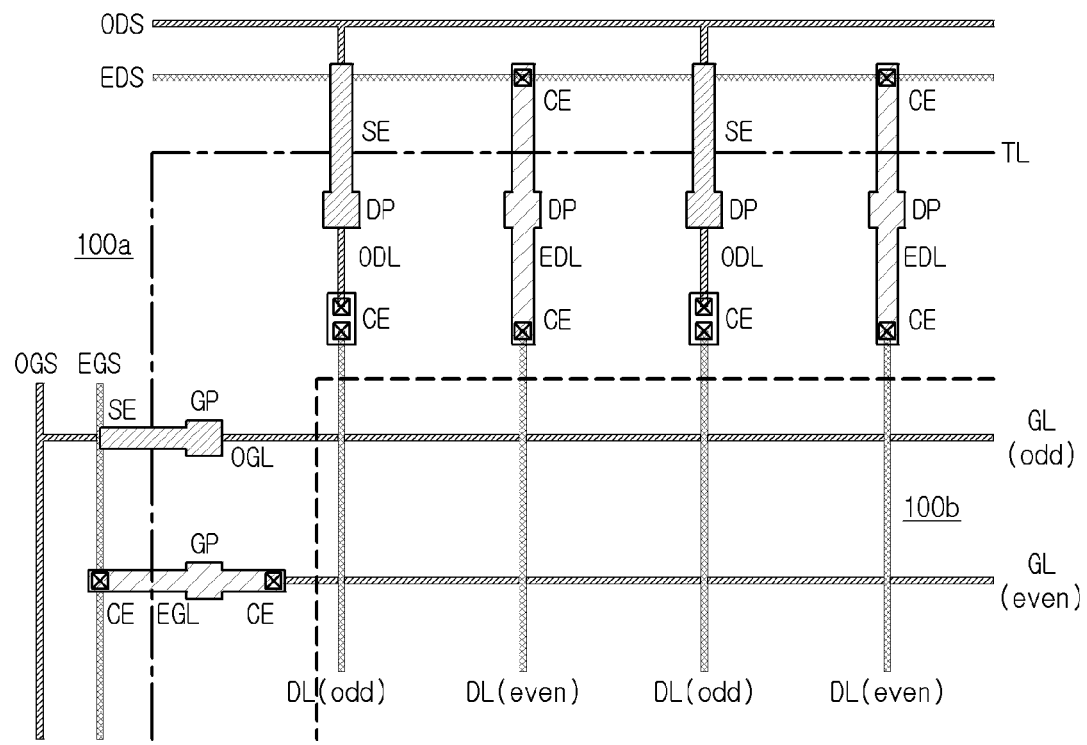
FIG. 10 is a layout view illustrating arrangement of electrodes on a display panel according to the third embodiment of the present invention.

Referring to FIG. 10, shield electrodes SE can be formed in the non-display area 100a. The shield electrodes SE can be formed in regions opposite to the trimming line TL. Also, the shield electrodes SE can be formed on outer half portions of the odd data link lines ODL and outer half portions of the odd gate link lines OGL.

The shield electrodes SE can be formed of a transparent conductive material, such as ITO (indium-tin-oxide) having a higher hardness compared to a gate electrode material.

When the substrate 100 is cut along the trimming line TL, the shield electrodes SE can reduce or prevent generation of a short circuit between the odd data link lines ODL and between the odd gate link lines OGL, which may occur due to a spread of the melted odd data link lines ODL and the odd gate link lines OGL during the cutting process.

The shield electrode SE can be simultaneously formed with the data pad DP through the same formation process as the data pad DP. And the shield electrode SE can be simultaneously formed with the gate pad GP through the same formation process as the gate pad GP.

Method for electrodes of display panel according to the fourth embodiment of the present Disclosure An electrode arrangement of a display panel 100 according to the fourth embodiment of the present invention will now be explained with reference to FIGS. 11 through 14.

Components of the fourth embodiment having the same or similar functions and shapes as those of the first through third embodiments may be referred to by the same reference numbers and names. Also, the description of the fourth embodiment overlapping with the first through third embodiments may be omitted.

The display panel 100 is defined into the non-display area 100a and the display area 100b.

Figure 11:
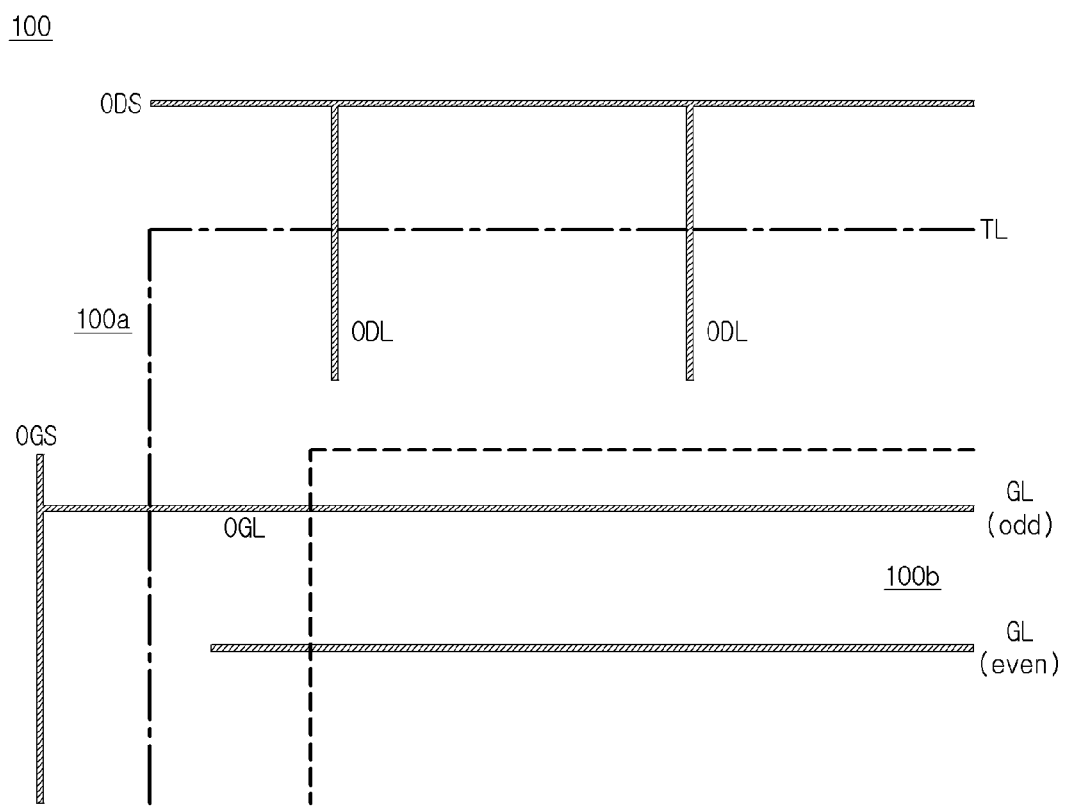
FIGS. 11 through 13 are layout views illustrating arrangement of electrodes on a display panel according to the fourth embodiment of the present invention.

Referring to FIG. 11, an odd data shorting bar ODS, an odd gate shorting bar OGS, odd data link lines ODL and odd gate link lines OGL can be arranged in the non-display area 100a.

The odd data link lines ODL can be separated from one another in a suitable distance to arrange even data link lines (not shown) therebetween. Similarly, the odd gate link lines OGL can be separated from one another in a suitable distance to arrange even gate link lines (not shown) therebetween.

The odd data link lines ODL can be directly connected to the odd data shorting bar ODS. The odd data link lines ODL and the odd data shorting bar ODS can be arranged perpendicularly to each other. Similarly, the odd gate link lines OGL can be directly connected to the odd gate shorting bar OGS. The odd gate link lines OGL and the odd gate shorting bar OGS can be arranged perpendicularly to each other.

The odd gate link lines OGL can be connected to respective odd gate lines GL(odd).

The odd gate lines GL(odd) directly connected to the respective odd gate link lines OGL can be arranged in the display area 100b. The odd gate lines GL(odd) can be arranged in directions perpendicular to the odd gate shorting bar OGS and in the same lines as the respective odd gate link lines OGL.

Among the gate lines GL, even gate lines GL(even), which will be connected to respective even gate link lines (not shown) and formed later, can be formed throughout the display area 100b and a part of the non-display area 100a. In other words, the even gate lines GL(even) can be formed in such a manner as to extend to a region of the non-display area 100a between a trimming line TL and an edge line of the display area 100b. However, the even gate lines GL(even) are beneficially formed without reaching the trimming line TL.

The odd data shorting bar ODS, the odd gate shorting bar OGS, the odd data link lines ODL and the odd gate link lines OGL on the non-display area 100a and the gate lines GL on the display area 100b can be formed from the same material as a gate electrode material and simultaneously through a common process.

Figure 12:
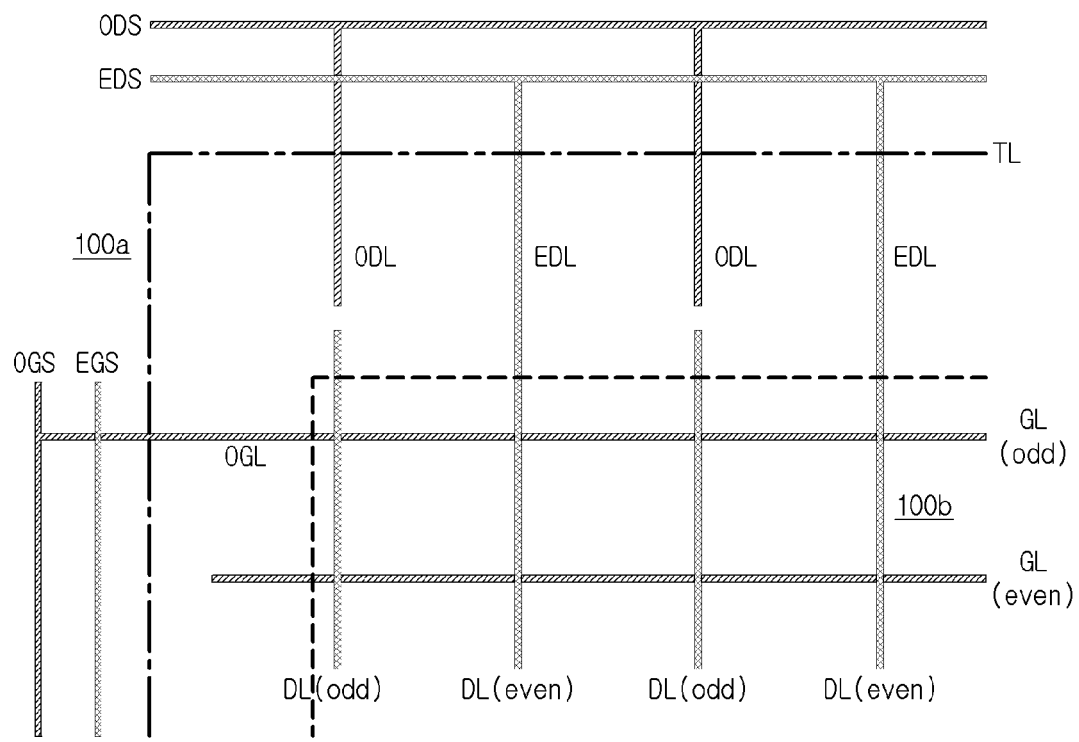

As illustrated in FIG. 12, an even data shorting bar EDS, even data link lines EDL and an even gate shorting bar EGS can be formed in the non-display area 100a. The even data link lines EDL can be formed by perpendicularly extending from the even data shorting bar EDS. Also, the even data shorting bar EDS, the even data link lines EDL and the even gate shorting bar EGS can be from the same material through the same process (or a common process). The even data shorting bar EDS can be separated from the odd data shorting bar ODS and formed parallel to the odd data shorting bar ODS. The oven gate shorting bar OGS can be separated from the odd gate shorting bar OGS and formed parallel to the odd gate shorting bar OGS.

A plurality of data lines DL can be formed on the display area 100b in such a manner as to cross the gate lines GL. Among the data lines DL, the odd data lines DL(odd) can be formed in the same lines as the respective odd data link lines ODL. Meanwhile, the even data lines DL(even) can be directly connected to the respective even data link lines EDL. The even data lines DL(even) can be formed from the same material and through the same process as the even data link lines EDL. In other words, the even data lines DL(even) can be simultaneously formed with the even data link lines EDL through a common process. Also, the odd data lines DL(odd) can be formed in such a manner as to be separated from the odd data link lines ODL.

The even data shorting bar EDS, the even gate shorting bar EGS and the data lines DL can be formed from the same material as a source or drain electrode material. Also, the even data shorting bar EDS, the even gate shorting bar EGS and the data lines DL can be simultaneously formed through a common process.

Before the even data shorting bar EDS, the even gate shorting bar EGS and the data lines DL are formed, an insulation material is deposited on the display panel 100.

Figure 13:
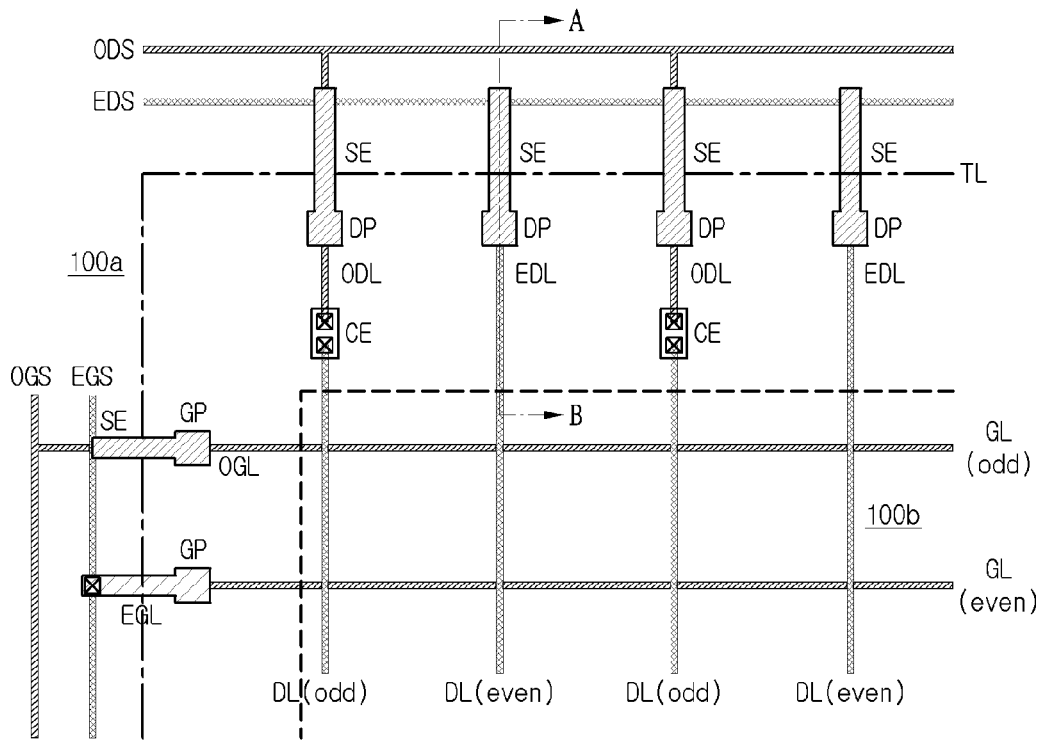

Referring to FIG. 13, even gate link lines EGL of a transparent conductive material such as ITO (indium-tin-oxide) are formed on the non-display area 100a. The even gate link lines EGL are used to electrically connect the even gate lines GL(even) to the even gate shorting bar EGS through contact holes. Also, contact electrodes CE are formed on the non-display area 100a. The contact electrodes CE can be used to electrically connect the odd data link lines ODL to the respective odd data lines DL(odd) through contact holes.

The data pads DP, gate pads GP and shield electrodes SE can be formed on the non-display area 100a. The data pads DP, the gate pads GP and the shield electrodes SE can be formed from a transparent conductive material such as ITO (indium-tin-oxide).

The shield electrode SE can be simultaneously formed with the data pad DP through the same formation process as the data pad DP. And the shield electrode SE can be simultaneously formed with the gate pad GP through the same formation process as the gate pad GP.

Figure 14:
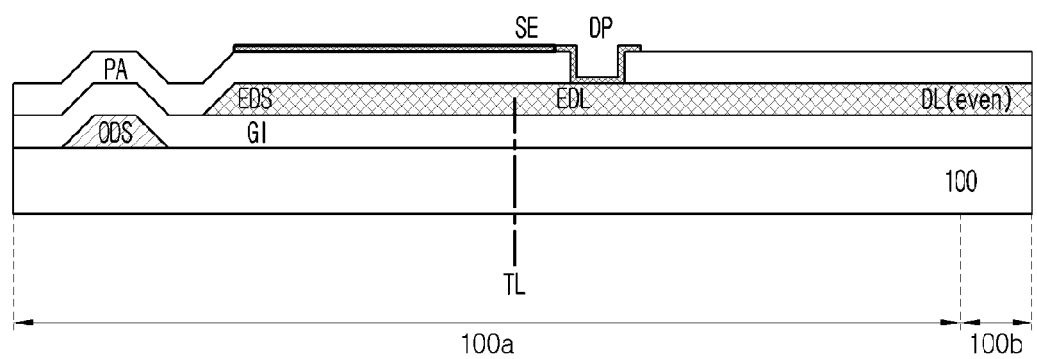
FIG. 14 is a cross-sectional view taken along dotted line A-B in FIG. 13.

FIG. 14 is a cross-sectional view taken along dotted line A-B in FIG. 13.

Referring to FIG. 14, the substrate 100 is defined into the non-display area 100a and the display area 100b. Also, a region of the trimming line TL represented by an alternate long and short dash line is defined within the non-display area 100a.

An odd data short bar ODS of a gate electrode material can be formed on the substrate 100 through a first process.

Subsequently, a gate insulation film GI of an inorganic insulation material such as silicon nitride or silicon oxide can be formed on an entire surface of the substrate 100 provided with the odd data shorting bar ODS through a second process.

An even data shorting bar EDS, an even data link line EDL and an even data line DL of a source or drain electrode material can be formed through a third process. In detail, the even data shorting bar EDS, the even data link line EDL and the even data line DL can be formed by depositing a metal such as chromium Cr on the gate insulation film GI and patterning the deposited metal using a mask procedure.

A fourth process allows a passivation layer PA used as a protective film to be formed by coating or depositing an insulation material on an entire surface of the substrate 100 provided with the even data shorting bar EDS, the even data link line EDL and the even data line DL.

Afterward, a data pad DP of a transparent conductive material such as ITO (indium-tin-oxide) is formed through a fifth process. In the fifth process, a contact hole is formed in the passivation layer PA and the data pad DP is formed on the passivation layer PA. The data pad DP can be electrically connected the even data link line EDL through the contact hole.

Also, a shield electrode SE can be formed on a region of the passivation layer PA opposite to the trimming line TL. The shield electrode SE can be formed from a transparent conductive material such as ITO (indium-tin-oxide). Such a shield electrode SE can be simultaneously formed with the data pad DP through the same formation process as the data pad DP.

The fourth embodiment of the present invention allows the even data link lines EDL arranged between the odd data link lines ODL to be formed of the source or drain electrode material, not the gate electrode material, which is different from the first embodiment. Also, the odd data link lines ODL and the even data link lines EDL are formed in different layers, and the source or drain electrode material forming the even data link lines EDL has a higher hardness compared to the gate electrode material. As such, although the odd data link lines of the gate electrode material are melted, generation of a short circuit between the odd and even data link lines adjacent to each other can be reduced or prevented. Moreover, the shield electrodes SE are formed in a region opposite (or corresponding) to the trimming line TL. As such, when the display panel 100 is cut along the trimming line TL, generation of a short circuit between the odd data and gate link lines ODL and OGL under the shield electrodes SE and the peripheral electrodes (i.e., the even data and gate link lines EDL and EGL) adjacent thereto can be reduced or prevented, even though the odd data and gate link lines ODL and OGL are melted and peripherally spread.

Procedure of Testing a Display Panel According to an Embodiment

Figure 15:
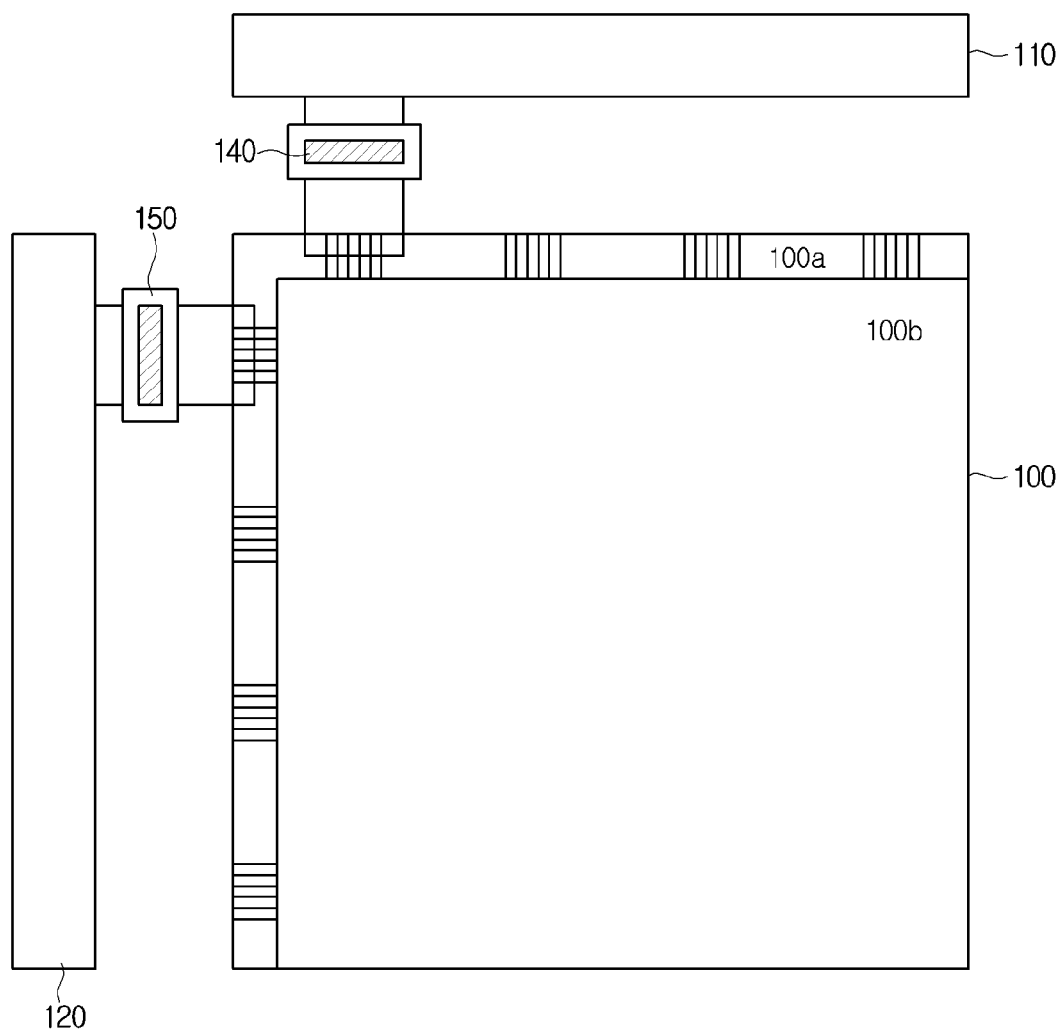
FIG. 15 is a block diagram illustrating a process of testing a display panel according to an embodiment of the present invention.

FIG. 15 is a block diagram illustrating a process of testing a display panel according to an embodiment of the present disclosure.

A method of testing a display panel 100 with one of the structures in accordance with the first through fourth embodiments of the present invention will now be explained with reference to FIG. 15.

The display panel 100 of a test object is fed to a test place, in which a test data driver 110 and a test gate driver 120 are disposed, by a feeder of an A/P (Auto Probe) needle system.

A plurality of data test probers 140 are arranged in the test data driver 110. Also, a plurality of gate test probers 150 are arranged in the test gate driver 120.

The data test prober 140 includes a data TCP (tape carrier package) loaded with a data driver IC (integrated circuit), and a plurality of A/P needles capable of being in electrical contact with the shorting bars that are formed in the non-display area 100 of the display panel 100.

Similarly, the gate test prober 150 includes a gate TCP loaded with a gate driver IC, and a plurality of A/P needles capable of being in electrical contact with the shorting bars that are formed in the non-display area 100a of the display panel 100.

The A/P needles come in contact with the odd and even data shorting bars ODS and EDS and the odd and even gate shorting bars OGS and EGS on the non-display area 100a. Subsequently, test signals are applied to the odd and even data shorting bars ODS and EDS and the odd and even gate shorting bars OGS and EGS, in order to test whether or not the display panel 100 is operating properly.

In this case, because driving signals and data signals are applied in a shorting bar unit, a failure test including inspections of a line defect, a point defect and so on can be performed. Also, the shorting bars are distinguished into the data shorting bars ODS and EDS and the gate shorting bars OGS and EGS. As such, the failure test can be independently performed not only between the data lines DL and the gate lines GL but also between the odd lines and the even lines. Moreover, because the test signals are applied in a pad unit, generation of a line defect in the related art shorting bar mode due to a signal propagation delay may be reduced or prevented.

After the test is completed, the shorting bars are removed from the display panel 100 by cutting the display panel 100 along the trimming line TL.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:
1. A display device comprising:
gate lines and data lines crossing each other to define unit pixel regions in a display area;
a pixel electrode in each unit pixel region;
a data shorting bar in a non-display area in substantially parallel with the gate lines;
a gate shorting bar in the non-display area in substantially parallel with the data lines;
gate link lines electrically connecting the gate lines to the gate shorting bar;

data link lines electrically connecting the data lines to the data shorting bar; and first shield electrodes including a conductive material that has a higher melting temperature than that of the at least one of the gate link lines and the data link lines, wherein at least one of the gate link lines and the data link lines are the first shield electrodes.

2. The display device of claim 1,
wherein the gate link lines include odd gate link lines and even gate link lines,
wherein the data link lines include odd data link lines and even data link lines,
wherein the even gate link lines and the even data link lines are the first shield electrodes.

3. The display device of claim 1, wherein the first shield electrodes overlap with a trimming line which is used for cutting away the gate and data shorting bars from the display area.

4. The display device of claim 1, further comprises:
gate pads connected to the respective gate link lines,
data pads connected to the respective data link lines.

5. The display device of claim 4, wherein the first shield electrodes are provided between the gate shorting bar and the gate pad or between the data shorting bar and the data pad.

6. The display device of claim 1, wherein the first shield electrodes are a transparent conductive material which is used to for the pixel electrode.

7. The display device of claim 1, further comprising a common electrode in each unit pixel region, the common electrode forming a horizontal electric field with the pixel electrode.

8. The display device of claim 1, further comprising: second shield electrodes partially cover the at least one of the gate link lines and the data link lines.

9. The display device of claim 6, wherein the transparent conductive material is ITO.

10. The display device of claim 1, wherein the gate shorting bar includes an odd gate shorting bar and an even gate shorting bar,
wherein the data shorting bar includes an odd data shorting bar and an even data shorting bar,
wherein the gate link lines include odd gate link lines and even gate link lines,
wherein the data link lines include odd data link lines and even data link lines,
wherein the odd gate shorting bar, the odd data shorting bar, the odd gate link lines, the odd data link lines and the gate lines are disposed on a same layer.

11. The display device of claim 10, wherein the odd gate shorting bar, the odd data shorting bar, the odd gate link lines and the odd data link lines are a first electrode material which is used for the gate lines.

12. The display device of claim 10, wherein the even gate shorting bar, the even data shorting bar and the data lines are disposed on a same layer,
further comprising: a first insulation film on between the gate lines and the data lines.

13. The display device of claim 12, wherein the even gate shorting bar and the even data shorting bar are a second electrode material which is used for the data lines.

14. The display device of claim 10, wherein the odd gate link lines are directly connected to the odd gate shorting bar, and
the odd data link lines are directly connected to the odd data shorting bar.

15. The display device of claim 14, wherein the first shield electrodes are connected between the even gate link lines and the even gate shorting bar, and
the first shield electrodes are connected between the even data link lines and the even data shorting bar.

16. The display device of claim 12, further comprising: a second insulation film on the data lines,
wherein the first shield electrodes are disposed on the second insulation film.

17. The display device of claim 10, wherein the odd gate link lines are directly connected to the gate lines, and
the odd data link lines are directly connected to the data lines.

18. The display device of claim 12, further comprising:
a first contact electrodes connected between the odd data link lines and the data lines,
a second contact electrodes connected between the even data shorting bar and the first shield electrodes.

19. The display device of claim 12,
wherein the data lines are include odd data lines and even data lines
further comprising:
a first contact electrodes connected between the odd data link lines and the odd data lines,
a third contact electrodes connected between the even data lines and the first shield electrodes.

20. The display device of claim 18, wherein the first contact electrodes are a transparent conductive material which is used to for the pixel electrode.

* * * * *